United States Patent [19]

Lee

[11] Patent Number: 4,924,119

[45] Date of Patent: May 8, 1990

[54] ELECTRICALLY PROGRAMMABLE ERASABLE INVERTER DEVICE WITH DEPROGRAMMING LIMITATION

[75] Inventor: Ruojia Lee, Boise, Id.

[73] Assignee: Micron Technology, Inc., Boise, Id.

[21] Appl. No.: 243,611

[22] Filed: Sep. 13, 1988

[51] Int. Cl.[5] .................................... H03K 19/094
[52] U.S. Cl. .................................. 307/469; 307/450; 307/465; 357/23.5
[58] Field of Search ............................ 307/450–451, 307/465, 468, 469; 357/23.5, 42; 365/184–185

[56] References Cited

U.S. PATENT DOCUMENTS

| | | | |
|---|---|---|---|
| 4,132,904 | 1/1979 | Harari | 357/23.5 X |
| 4,596,938 | 6/1986 | Cartwright, Jr. | 307/469 X |
| 4,652,773 | 3/1987 | Cartwright, Jr. | 307/469 |
| 4,829,203 | 5/1989 | Ashmore, Jr. | 307/465 X |

*Primary Examiner*—David Hudspeth
*Attorney, Agent, or Firm*—Stanley N. Protigal; Angus C. Fox, III; Jon P. Busack

[57] ABSTRACT

A circuit having both p-channel and n-channel transistors is made programmable by providing the p-channel transistor with a floating gate which is in electrical continuity with a floating gate which is in electrical continuity with a floating gate on the n-channel transistor. In order to compensate for over-deprogramming, the circuit includes transistor which shunt the programmable transistors when the transistors are over-deprogrammed.

19 Claims, 3 Drawing Sheets

ELECTRICALLY PROGRAMMABLE ERASABLE INVERTER DEVICE WITH DEPROGRAMMING LIMITATION

FIELD OF THE INVENTION

This invention relates to semiconductor circuit devices, and to circuit elements on such semiconductor circuit devices. Specifically, the invention relates to an inverter circuit which is electrically programmable and electrically erasable.

BACKGROUND OF THE INVENTION

The invention uses various materials which are electrically either conductive, insulating or semiconducting, although the completed semiconductor circuit device itself is usually referred to as a "semiconductor". One of the materials used is silicon, which is used as either single crystal silicon or as polycrystalline silicon material, referred to as polysilicon or "poly" in this disclosure.

An electrically programmable and electrically erasable programmable access memory (EEPROM) utilizes floating gate transistors which are programmed and deprogramed by Fowler-Nordheim tunneling through a thin gate oxide window near the drain side of the transistor. The transistor is an n-channel transistor and programming is achieved by applying a relatively high positive potential (voltage or EMF) to a control gate. A floating gate is isolated from the control gate and the source and drain of the transistor and is interspaced between the control gate and the transistor substrate. The floating gate has a coupling coefficient of between 0 (no isolation from the substrate) and 1 (no isolation from the gate).

The transistor may be programmed by applying a high positive potential to the control gate with respect to the drain. The floating gate reaches a potential proportional to the control gate potential times the coupling coefficient. If the potential of the control gate is sufficiently high, Fowler-Nordheim tunneling through a thin gate oxide window near the drain side of the transistor closes the floating gate to become negatively charged. This results in threshold voltage of a higher value, usually sufficient to exceed the potentials at which the transistor normally operates, thereby deprogramming the transistor. Deprogramming is accomplished by applying, from the gate, a high negative potential to the drain side of the transistor.

The floating gate technique works very well n-channel transistors, but is difficult to achieve in the case of p-channel transistors. This is because of the oxide-silicon barrier for holes is much greater than that of electrons. For this reason, prior art programmability of inverter devices has been difficult.

SUMMARY OF THE INVENTION

In accordance with the present invention, a programmable inverter is made possible by connecting the drains on an n-channel and the sources of two p-channel transistors to an output, and having the gates of the transistors respond to a common input. The n-channel and one of the p-channel transistors share a common floating gate and the inverter is programmed by Fowler-Nordheim tunneling through a thin gate oxide window on the drain side of the n-channel transistor. The floating gates are isolated, except that the floating gate is electrically conductive between the n-channel and p-channel transistors. Therefore, the programming of the n-channel transistor results in a like charge on the floating gate of the p-channel transistor. This enables the entire inverter to be programmed by performing the steps of programming the n-channel transistor. An additional pair of transistors is used to compensate for the effects of excessive positive charge of the floating gate on deprogramming.

This device can use as few as two novel transistors: one n-channel and one p-channel transistor. Due to the unique layout, these two transistors have the characteristics of four transistors. These include a pair of p-channel transistor with common control gates, one n-channel transistor with a floating gate which is common with a floating gate of one of the p-channel transistors and one n-channel transistor without a floating gate.

This device is programmed and deprogramed by Fowler-Nordheim tunneling through the thin gate oxide window near the drain side of the n-channel transistor (having the floating gate). Programming is achieved by applying relatively high positive potential on the control gate. Due to Poly 2 (control gate) and Poly 1 (floating gate) capacitive coupling, some high positive potential will be coupled to the floating gate and generate a strong electric field across the thin tunneling window. This electric field will make it possible for the electrons in the n-channel drain region to tunnel through to Si/Oxide barrier. The trapped negative charge will shift the $V_T$ of the n-channel transistor to transistor 31 to a higher value, say 5 to 6 volts, while shifting the $V_T$ value of the p-channel transistor transistor 33 to a positive value. Now we can consider n-channel transistor is being cut off while the p-channel transistor is being completely turned on (in a non-volatile state). The device is therefore no longer functioning as an inverter and the output will stay high independent of the input (gate) signal.

Deprogramming is made possible by applying a high positive potential on the drain of the n-channel transistor and a zero potential or a negative potential on the control gate. The electrons will then be transferred by Fowler-Nordheim tunneling through the thin oxide window from the floating gate to drain, due to the reverse electric field direction. After deprogramming, the floating gate potential will be non-negative. If there is neither negative nor positive charge remaining in the floating gate, the $V_T$ valves of both p-channel and n-channel transistors will be as they were prior to being programmed. The device will once again function as an inverter.

In the event that the floating gate transistors are overly programmed, i.e., the floating gate is brought to a positive charge, the n-channel transistor will be in a depletion state and the p-channel transistor will be in a "cut-off" state due to $V_T$ shift.

The floating gate does not extend completely across the area covered by the control gate on the n-channel transistor, so a small portion of the n-channel transistor is fabricated without the floating gate. This effectively behaves as a second n-channel transistor in series with the other n-channel transistor. The second n-channel transistor and the second p-channel transistor, without the floating gates, avoid the problem of $V_T$ shift due to over-deprogramming.

DETAILED DESCRIPTION OF THE PREFERRED EMBODIMENT

Figure 1:
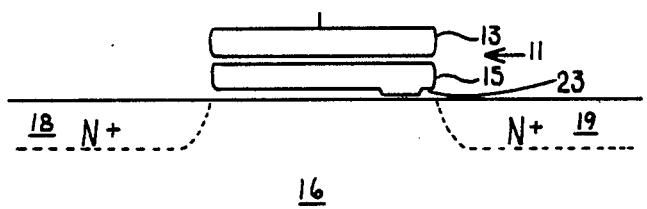
FIG. 1 shows a configuration of an n-channel transistor fabricated in accordance with the present invention.

FIG. 1 shows a floating gate transistor 11, in which a control gate 13 and a floating gate 15 control flow of electrons between doped regions of substrate 16 which form a source 18 and drain 19 of the transistor 11. A thin tunneling window is formed by a portion 23 of the floating gate 15 being located close to the drain 19, separated by a thin layer of oxide of approximately 100 A. This portion 23 defines the location of a thin tunneling window, so that electrons from the drain 19 will tunnel through to the floating gate 15, establishing a negative charge for the gate 15. This will shift the $V_T$ of the transistor 11. In a typical application, this shift of $V_T$ is to a value of approximately 10 volts. If the potential at the control gate 13 does not exceed this 10 volts, the transistor 11 will remain gated off.

Deprogramming is made possible by applying a high positive potential on the drain 19 of the transistor 11 and a zero potential or a negative potential to the control gate 13. Electrons will then be transferred from the floating gate 15 by Fowler-Nordheim tunneling through the thin oxide window, to drain 19. This transfer of electrons from floating gate 15 to drain 19 is due to the reverse electric field direction.

Figure 2:
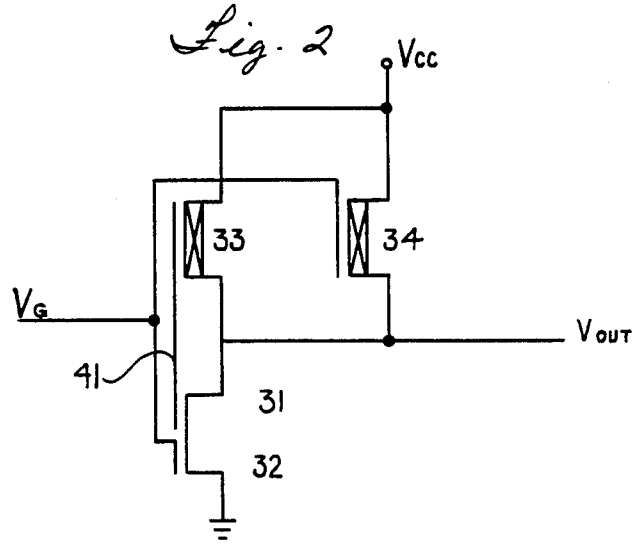
FIG. 2 shows a schematic configuration of an equivalent circuit of an erasable inverter circuit in accordance with the present invention.

An inverter configuration is shown in FIG. 2, where a pair of n-type transistors 31, 32 are connected in series to a parallel connection of a pair of p-type transistors 33, 34. The series pair of n-type transistors 31, 32 appear as a single transistor, on the assumption that the floating gate 15 will force the $V_T$ upward, gating the pair off, regardless of the gated condition of transistor 32.

In order to control $V_T$ of p-type transistor 33, it has a floating gate 41. This does not by itself provide for programmability of the inverter because the Fowler-Nordheim technique is more practical with n-channel transistors than with p-channel transistors. Thus, it is normally more difficult to provide programmable inverter where the inverter circuit includes p-type and n-type transistors.

The floating gate 41 of transistor 33 has electrical continuity with the floating gate 15 of transistor 31. Thus, programming of transistor 31 has the effect of programming transistor 33. In other words, if floating gate 15 is charged in order to increase $V_T$ for transistor 31, that same charge applies to floating gate 41 of transistor 33, and raises $V_T$ of transistor 33 accordingly.

Since the increase in $V_T$ of transistor 33 allows transistor 33 to be gated off at higher potentials and therefore be conductive until higher gate potentials, the connection of transistor 34 in parallel with transistor 33 has little effect, since transistor 33 is conductive under normal circumstances when transistor 34 is conductive.

After deprogramming, the floating gate potential will be non-negative. If there is neither negative nor positive charge remaining in the floating gate 15, both p-channel and n-channel transistor $V_T$s will be as they were prior to being programmed. The device will once again function as an inverter.

On the other hand, in the event that the floating gate transistors are overly programmed, i.e., the floating gate is brought to a positive charge, transistor 31 will be in a depletion state and transistor 33 will be in a "cut-off" state due to $V_T$ shift.

In the inverter configuration is shown in FIG. 2, the floating gates 15, 41 of transistors 31 and 33 have coupling coefficients of approximately 0.6 to 0.7.

Figure 3:
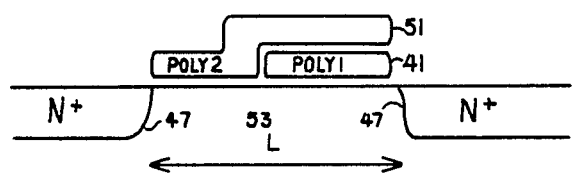
FIG. 3 shows a configuration of an n-channel transistor fabricated in accordance with the present invention.

FIG. 3 shows the construction of transistors 31 and 32. The transistors 31, 32 share a common source 47 and drain 48, with the transistors 31, 32 being distinguished by their gates 41, 51. Transistor 31 includes floating gate 41, whereas where control gate 51 is not separated from a substrate 53 by the floating gate 41, transistor 32 is defined.

Figure 4:
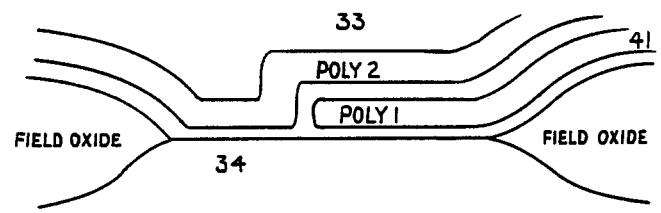
FIG. 4 shows a configuration for a p-channel transistor fabricated in accordance with the present invention.

FIG. 4 shows the configuration of transistors 33, where the floating gate extends partially beneath a second gate structure, with the source and drain (not shown) being located in the area of the floating gate 41.

Figure 5:
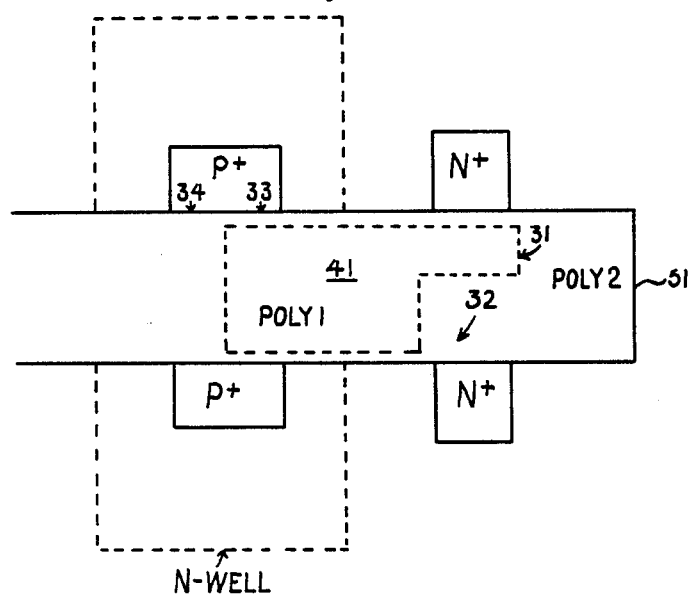
FIG. 5 shows a top view of an inverter circuit constructed in accordance with the present invention.

In order to construct the inverter, the layout shown in FIG. 5 is employed. In this case, the floating gate 41 extends across the structures of doped sections of the substrate, with the control gate 51 extending across each transistor 31-34.

Figure 6:
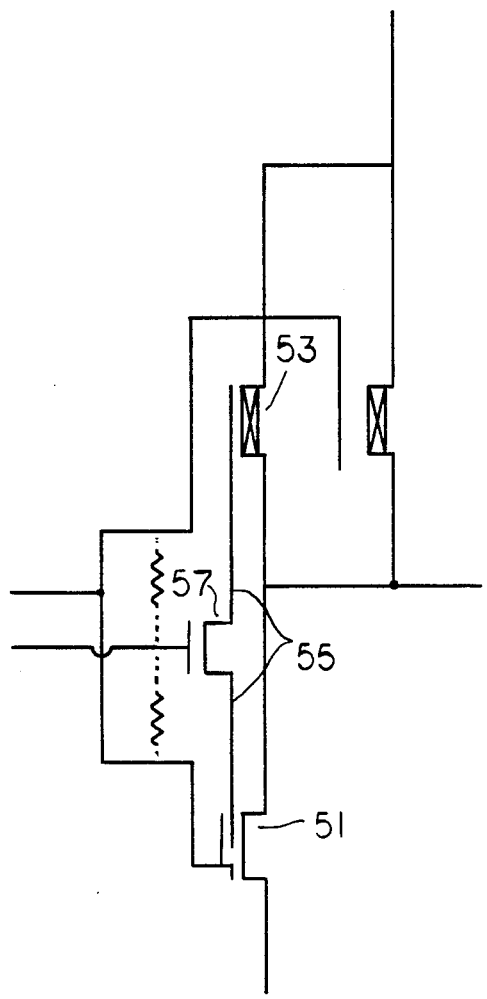
FIG. 6 shows an electrical schematic drawing of an equivalent of an alternate embodiment of the invention.

FIG. 6 shows an arrangement in which an n-channel transistor 51 and a p-channel transistor 53 share a floating gate 55 which exhibits electrically isolation between the transistors 51, 53. A gated connection 57 between the transistors 51, 55 is facilitated by the fact that a layer of oxide must be deposited or grown subsequent to the deposition of polysilicon which forms the floating gate 55. While it is possible to conduct current across the floating gate 55 through the substrate (not shown), leakage current may make this path impractical. Therefore, gating across the floating gate 55 would be through a connection (connection 57) which is isolated from the substrate.

What has been shown are specific configurations for inverters, using the inventive features which will be described in the following claims. Accordingly, the invention should not be construed as limited to the preferred embodiment which has just been described.

I claim:

1. Inverter circuit, in which the inverter is programmable, characterized by:
   (a) a first n-channel transistor having a floating gate extending over a substrate and a control gate extending over the floating gate, the floating gate being electrically isolated from the substrate and from the control gate, and having a gate oxide window adjacent to the drain, the control gate receiving an input signal;
   (b) a p-channel transistor;
   (c) the p-channel transistor having a floating gate and a control gate, the floating gate extending between the control gate and source and drain regions of the p-channel transistor, said control gate of the p-channel transistor being connected to the control gate of the first n-channel transistor so as to receive the input signal;

(d) the floating gates of the n- and p-channel transistors being in electrical communication with each other;

(e) a second n-channel transistor connected in series with the floating gate n-channel transistor, the second n-channel transistor having a transition voltage not controlled by the floating gates, the second n-channel transistor having a control gate connected to the control gate of the first n-channel transistor and the p-channel transistor;

(f) the second n-channel transistor being fabricated as a section of the floating gate n-channel transistor, with the floating gate not extending across an area defined by a gate portion of the second n-channel transistor; and (g) an output terminal connected in common to the first and second n-channel transistors and to the p-channel transistor.

2. Circuit as described in claim 1, further characterized by:

a second p-channel transistor connected in parallel with the floating gate p-channel transistor, the second p-channel transistor having a transition voltage not controlled by the floating gates.

3. Circuit as described in claim 2, further characterized by:

the transistors being fabricated on a single integrated circuit chip.

4. Circuit as described in claim 2, further characterized by:

(a) the transistors being fabricated on a single integrated circuit chip, wherein the floating gates are formed as a single layer of polysilicon deposited over a doped silicon substrate;

(b) a first oxide layer is interposed between the floating gates and the substrate;

(c) the control gates are formed as a second layer of polysilicon;

(d) a second oxide layer interposed between the floating gates and the control gates.

5. Circuit as described in claim 4, further characterized by:

(a) a transistor connected in series between the floating gates; and (b) the floating gates being in said electrical communication only when the transistor is conducting.

6. Circuit as described in claim 1, further characterized by:

(a) the transistors being fabricated on a single integrated circuit chip, wherein the floating gates are formed as a single layer of polysilicon deposited over a doped silicon substrate;

(b) a first oxide layer is interposed between the floating gates and the substrate;

(c) the control gates are formed as a second layer of polysilicon;

(d) a second oxide layer interposed between the floating gates and the control gates.

7. Circuit as described in claim 1, further characterized by:

a second p-channel transistor connected in parallel with the floating gate p-channel transistor, the second p-channel transistor having a transition voltage not controlled by the floating gates.

8. Circuit as described in claim 1, further characterized by:

(a) a transistor connected in series between the floating gates; and (b) the floating gates being in said electrical communication only when the transistor is conducting.

9. Circuit including p-channel and n-channel transistors, in which at least one p-channel transistors are programmable with respect to its transition voltage. characterized by:

(a) a first n-channel transistor having a floating gate extending over a substrate and a control gate extending over the floating gate, the floating gate being electrically isolated from the substrate and from the control gate, and having a gate oxide window adjacent to the drain, the control gate receiving an input signal;

(b) the p-channel transistor having a floating gate and a control gate, the floating gate extending between the control gate and source and drain regions of the p-channel transistor, said control gate of the p-channel transistor being connected to the control gate of the first n-channel transistor so as to receive the input signal;

(c) the floating gates of the n- and p-channel transistors being in electrical communication with each other;

(d) a second n-channel transistor connected in series with the floating gate n-channel transistor, the second n-channel transistor having a transition voltage not controlled by the floating gates, the second n-channel transistor having a control gate connected to the control gate of the first n-channel transistor and the p-channel transistor;

(e) the second n-channel transistor being fabricated as a section of the floating gate n-channel transistor, with the floating gate not extending across an area defined by a gate portion of the second n-channel transistor; and (f) an output terminal connected in common to the first and second n-channel transistors and to the p-channel transistor.

10. Circuit as described in claim 9, further characterized by:

a second p-channel transistor connected in parallel with the floating gate p-channel transistor, the second p-channel transistor having a transition voltage not controlled by the floating gates.

11. Circuit as described in claim 10, further characterized by:

the transistors being fabricated on a single integrated circuit chip.

12. Circuit as described in claim 10, further characterized by:

(a) the transistors being fabricated on a single integrated circuit chip, wherein the floating gates are formed as a single layer of polysilicon deposited over a doped silicon substrate;

(b) a first oxide layer is interposed between the floating gates and the substrate;

(c) the control gates are formed as a second layer of polysilicon;

(d) a second oxide layer is interposed between the floating gates and the control gates.

13. Circuit as described in claim 9, further characterized by:

(a) the transistors being fabricated on a single integrated circuit chip, wherein the floating gates are formed as a single layer of polysilicon deposited over a doped silicon substrate;

(b) a first oxide layer is interposed between the floating gates and the substrate;

(c) the control gates are formed as a second layer of polysilicon;

(d) the second oxide layer is interposed between the floating gates and the control gates.

14. Circuit as described in claim 9, further characterized by:
a second p-channel transistor connected in parallel with the floating gate p-channel transistor, the second p-channel transistor having a transition voltage not contolled by the floating gates.

15. Circuit as described in claim 14, further characterized by:
(a) a transistor connected in series between the floating gates; and
(b) the floating gates being in said electrical communication only when the transistor is conducting.

16. Circuit as described in claim 15, further characterized by:
the transistor connected in series between the floating gates being gated by potentials required for at least one Fowler-Nordheim operation applied to the n-channel transistor.

17. Inverter circuit, in which the inverter is programable, characterized by:
(a) an n-channel transistor having a floating gate extending over a substrate and a control gate extending over the floating gate, the floating gate being electrically isolated from the substrate and from the control gate, and having a gate oxide window adjacent to the drain, the control gate receiving an input signal;
(b) a p-channel transistor;
(c) the p-channel transistor having a floating gate and a control gate, the floating gate extending between the control gate and source and drain regions of the p-channel transistor, said control gate of the p-channel transistor being connected to the control gate of the n-channel transistor so as to receive the input signal;
(d) the floating gates of the n- and p-channel transistors being in electrical communication with each other;
(e) an output terminal connected in common to the n-channel transistor and to the p-channel transistor;
(f) a transistor connected in series between the floating gates; and
(g) the floating gates being in said electrical communication only when the transistor is conducting.

18. Circuit including p-channel and n-channel transistors, in which at least one p-channel transistors are programable with respect to its transition voltage, characterized by:
(a) a first n-channel transistor having a floating gate extending over a substrate and a control gate extending over the floating gate, the floating gate being electrically isolated from the substrate and from the control gate, and having a gate oxide window adjacent to the drain, the control gate receiving an input signal;
(b) the p-channel transistor having a floating gate and a control gate, the floating gate extending between the control gate and source and drain regions of the p-channel transistor, said control gate of the p-channel transistor being connected to the control gate of the first n-channel transistor so as to receive the input signal;
(c) the floating gates of the n- and p-channel transistors being in electrical communication with each other;
(d) a second n-channel transistor connected in series with the floating gate n-channel transistor, the second n-channel transistor having a transition voltage not controlled by the floating gates, the second in-channel transistor having a control gate connected to the control gate of the first n-channel transistor and the p-channel transistor;
(e) an output terminal connected in common to the first and second n-channel transistors and to the p-channel transistor;
(f) a transistor connected in series between the floating gates; and
(g) the floating gates being in said electrical communication only when the transistor is conducting.

19. Circuit as described in claim 18, further characterized by:
the transistor connected in series between the floating gates being gated by potentials required for at least one Fowler-Nordheim operation applied to the n-channel transistor.

* * * * *

UNITED STATES PATENT AND TRADEMARK OFFICE
CERTIFICATE OF CORRECTION

PATENT NO. : 4,924,119
DATED : May 8, 1990
INVENTOR(S) : Ruojia Lee

It is certified that error appears in the above-identified patent and that said Letters Patent is hereby corrected as shown below:

Column 8, line 28, delete "in-channel" and insert -- n-channel --.

Signed and Sealed this

Twenty-third Day of November, 1993

Attest:

BRUCE LEHMAN

Attesting Officer                Commissioner of Patents and Trademarks